United States Patent [19]

Herndon

[11] 4,442,509

[45] Apr. 10, 1984

[54] BIT LINE POWERED TRANSLINEAR MEMORY CELL

[75] Inventor: William H. Herndon, Sunnyvale, Calif.

[73] Assignee: Fairchild Camera & Instrument Corporation, Mountain View, Calif.

[21] Appl. No.: 315,679

[22] Filed: Oct. 27, 1981

[51] Int. Cl.³ .............................................. G11C 13/00
[52] U.S. Cl. .................................... 365/154; 365/175
[58] Field of Search ........................ 365/154, 174, 175

[56] References Cited

U.S. PATENT DOCUMENTS 4,023,148 5/1977 Heuber et al. ...................... 365/175
4,091,461 5/1978 Booher ................................ 365/154

OTHER PUBLICATIONS

IBM Tech. Dis. Bul. vol. 23 no. 1 Jun. 1980 "Memory Cell Adopted for Different Combinations of Simultaneous Read and Write Operations" by Cavaliere pp. 180–186.

Primary Examiner—Terrell W. Fears
Attorney, Agent, or Firm—Kenneth Olsen; Carl L. Silverman; Ronald Craig Fish

[57] ABSTRACT

A bit line powered translinear memory cell includes a pair of NPN transistors Q101 and Q102 having cross-coupled bases and collectors. Diode loads D101 and D102 couple the NPN transistors Q101 and Q102 to the bit lines 301 and 302. The emitters of the two transistors Q101 and Q102 are coupled together and to a word line 103. Cell parasitic capacitances C101 and C102 are used to maintain data in nonaddressed memory cells during reading of other cells coupled to the same word line 103.

14 Claims, 3 Drawing Figures

READ OPERATION

WRITE OPERATION

BIT LINE POWERED TRANSLINEAR MEMORY CELL

BACKGROUND OF THE INVENTION

1. Field of the Invention

This invention relates to memory cells, and in particular to a bit line powered static bipolar random access memory cell.

2. Description of the Prior Art

The application of the translinear principle to digital integrated circuits was first proposed by E. Seevinck in IEEE Journal of Solid State Circuits, Volume SC-13, No. 4, Aug. 19, 1978 at pages 528–530. In that paper Seevinck uses diodes as loads for a random access memory cell. The potential drop thereby created, however, is so large as to require a below ground power supply on the commonly coupled emitters of the RAM cell. This requirement made it difficult to utilize Seevinck's cell in conjunction with conventionally available power supplies.

The operation of translinear memory cells has also been discussed in J. Lohstroh, "Static Bipolar RAM Cell with Compact Punch-Through Loads," Digest of Technical Papers, 1979 International Solid State Circuit Conference, February 1979, pages 14–15. In that reference and in the Seevinck paper mentioned above, the principles of operation of the translinear memory cell are discussed. In a translinear memory cell a regenerative circuit with cross coupled transistors using diodes as loads is possible if the ideality factor of the diode is greater than one. The ideality factor of a diode is defined by n where:

$$I_D = I_s e^{\frac{qV_D}{nKT}}$$

Where $I_D$ is the current through the diode, $I_s$ is the saturation current, e is the base of natural logarithms, q is the charge on an electron, $V_D$ is the voltage across the diode, K is Boltzman's constant, and T is the absolute temperature.

I, in may U.S. Pat. No. 4,032,902 issued June 28, 1977, and entitled "Semiconductor Memory Cell Circuit and Structure," teach the fabrication and operation of a bit line powered integrated circuit memory cell structure.

SUMMARY OF THE INVENTION

This invention provides a static bipolar random access memory cell particularly suitable for implementation in an integrated circuit. The cell is powered by the bit lines and operated using the translinear priniciple, without the need for unusual power supplies. In a preferred embodiment the memory cell circuit comprises a word line, a pair of bit lines, a first and second transistor each having a base, an emitter, and a collector, the first emitter and second emitter being coupled togther and to the word line, the first base being coupled to the second collector, and the second base being coupled to the first collector to thereby provide cross-coupled storage nodes, a first diode coupled between one of the bit lines and the first base and a second diode coupled between the other of the bit lines and the second base.

The transistors are typically NPN devices fabricated in an integrated circuit in which the parasitic capacitance between the bases of the transistors and the word line is used to maintain the data stored in the cell during the time the cell is read. The elimination of resistors from the memory cell circuit permits scaling of the circuit as advances are made in integrated circuit lithography. The cell logic swing is small which increases circuit performance, and the cell deaddressed condition is the same as the condition when power to all the peripheral circuits is eliminated.

DESCRIPTION OF THE PREFERRED EMBODIMENTS

Figure 1:
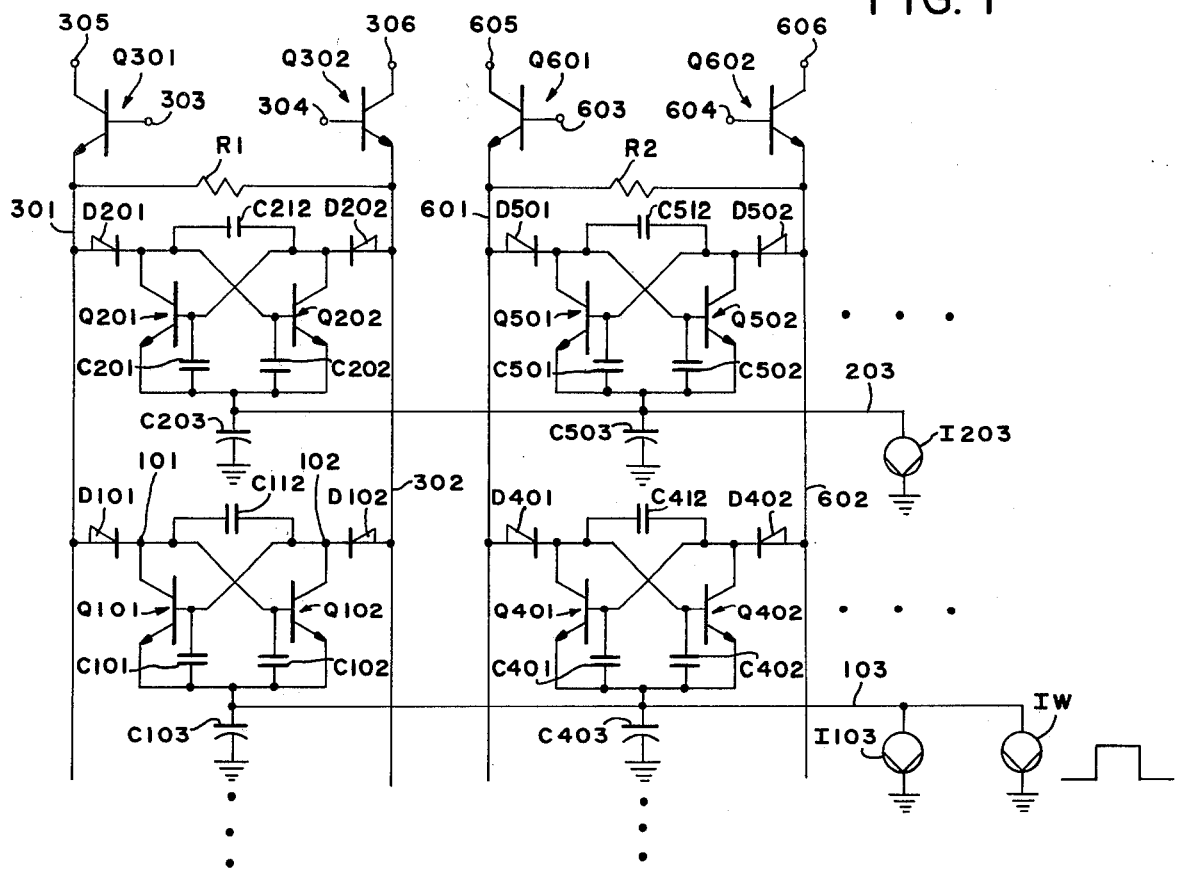
FIG. 1 is a schematic drawing illustrating the memory cell of this invention and the manner in which a plurality of such cells may be coupled together to form an array.

FIG. 1 illustrates a plurality of the bit line powered translinear memory cells of this invention interconnected to form a portion of a memory array. As shown in FIG. 1 a single memory cell is comprised of a cross-coupled pair of NPN transistors Q101 and Q102. A first diode D101 and a second diode D102 serve as loads for the cross-coupled transistors Q101 and Q102. In addition diodes D101 and D102 serves as a means for coupling the cell to the bit lines 301 and 302. As shown in FIG. 1 any desired number of such cells may also be coupled between bit lines 301 and 302 to form a column of memory cells. In FIG. 1 a second memory cell comprised of transistors Q201 and Q202 and diodes D201 and D202 is also coupled between the bit lines 301 and 302.

The commonly coupled emitters of the cross-coupled transistors Q101 and Q102 of each memory cell are coupled to a word line 103 as shown. In a similar manner the emitters of other cells in the same column are coupled together and to other word lines such as word line 203. As many memory cells as desired may also be coupled to the same word line. For example, the memory cell comprised of transistors Q401 and Q402 is also coupled to word line 103. Additional cells may also be added. In this manner an array of memory cells is formed having columns of cells coupled between bit lines and rows of cells coupled to word lines. In addition to sharing the bit lines, each column of cells shares the same sense amplifier Q301 and Q302, while each row of cells shares the same current source I103.

When fabricated in an integrated circuit embodiment, the memory cells will include parasitic capacitances which are also shown in FIG. 1. In prior art memory cells the parasitic capacitances hinder the operation of the cell and are typically viewed as undesirable. It is a feature of this invention, however, that the parasitic capacitances created in an integrated circuit embodiment of the memory array of FIG. 1 are utilized in the operation of the memory cell. These parasitic capacitances are shown in conjunction with each of the cross-coupled pair of NPN transistors and the load diodes. For example, each of the cross-coupled pair of the NPN transistors Q101 and Q102 includes a parasitic capacitance between the epitaxial layer which comprises the base of the each of the transistors and the buried layer which comprises the emitter of the each of the transistors. These base-emitter capacitances are designated C101 and C102 in FIG. 1, and typically each will be on the order of approximately 24 femtofarads. In addition, each transistor pair includes a collector-base capacitance, designated C112 in FIG. 1. Typically this capacitance is also on the order 24 femtofarads. The capacitance C112 is shown between the collectors of transistors Q101 and Q102 because the cross-coupled bases and collectors of the two transistors short the collector-base capacitance of each together and therefore this combined capacitance is representated as a single capacitances C112.

Each memory cell in an integrated circuit embodiment also will possess a capacitance between the buried layer forming the emitters of the cross-coupled transistor pair and the underlying semiconductor substrate. This capacitance is shown as C103 in FIG. 1, and will typically be on the order of 160 femtofarads. Similar base-emitter, collector-base, and buried layer-isolation capacitances are shown for each of the memory cells in FIG. 1.

In addition to the electronic components and parasitic capacitances described, each pair of bit lines 301 and 302 includes a resistor R1 coupled between the bit lines. The resistance of resistor R1 is made sufficiently small, for example, on the order of 1000 ohms, to maintain the voltage of line 302 at approximately the same level as line 301, even if all but one of the cells sharing the common bit lines are in a state such that current from the cells flows through bit line 302.

An individual cell within the memory array shown in FIG. 1 has three modes of operation—standby, read and write. These operations are described below in conjunction with FIGS. 2 and 3. For the standby mode of operation the memory array is biased with only a standby current in all the word lines 103 and 203. This current will be on the order of 0.5 to 1 microamp. The standby current may be chosen to be as small as desired as long as the individual transistors in each cell maintain a reasonable gain. The potential applied to nodes 303, 304, 603, and 604 will be equal and approximately zero volts. These conditions will cause the cell current, which is the current flowing through the "on" transistor collector and through the diode and bit line connected to the "on" transistor, to be approximately equivalent in all cells. For example, if transistor Q102 is the "on" transistor of that memory cell and transistor Q501 is the "on" transistor of that memory cell, the currents flowing through transistor Q102 and diode D102 to bit line 302 will be approximately equal to the current flowing through the transistor Q501 and diode D501 to bit line 601. Resistor values R1 and R2 are sufficiently small to maintain the potential of bit lines 301, 302, 601, and 602 at approximately same level.

Figure 2:
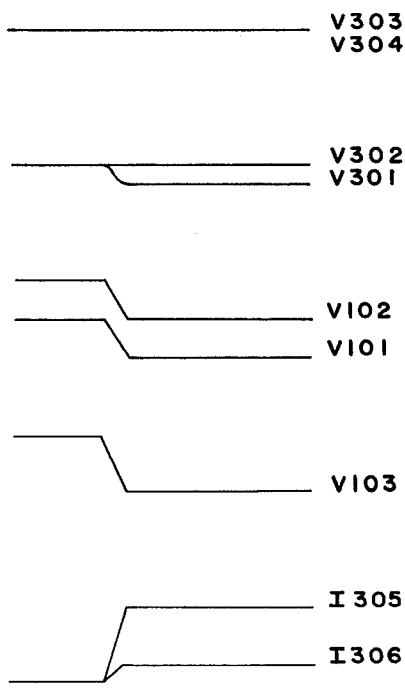
FIG. 2 is a pulse diagram illustrating potentials and currents resulting from reading data in a cell.

Reading of an individual cell within the memory array is accomplished by pulsing a current IW into the addressed word line 103. A pulse diagram for a read operation is shown in FIG. 2. In the reading operation all cells connected to the addressed word line are read at the same time, with the pairs of bit lines being used to select the individual cells desired. For example, if the cell comprised of transistors Q101 and Q102 is to be read, a current IW will be applied to word line 103. This causes reading of all cells connected to that word line, however, the individual cell desired is isolated by sensing the current into nodes 305 and 306.

Application of the reading current IW to the word line 103 lowers the potential V103 of line 103 as shown in FIG. 2. The word line current is split among all cells sharing the word line. Cell current flows through the "on" transistor of each cell connected to the word line 103, and through the diode associated with that "on" transistor into the bit line connected to the diode. For example, if Q101 is on, current will flow into bit line 301 because the potential V101 of node 101 is lower than the potential V102 of node 102 as shown in FIG. 2. The forward bias of diode D101 cause the potential of node 101 to fall a diode drop below the potential V301 of line 301. More current then flows through line 301 causing the potential V301 of line 301 to be slightly lower than the potential V302 of line 302. The collector current I305 of transistor Q301 therefore will be greater than the collector current I306 of transistor Q302 and this difference may be read.

In the preferred embodiment, the word line current is made sufficiently large, for example, on the order of 200 microamps, to generate a current difference I304 and I305 between the sense amplifier transistors Q301 and Q302 that will overcome the standby current of the cells which are not addressed but also connected to the same bit line pair 301 and 302. This current difference between transistors Q301 and Q302 is used to drive well known output amplifiers coupled to nodes 305 and 306 to read the data of the addressed cells.

During the read operation the current increase through the sense amplifier tansistors Q301 and Q302 causes the voltage of lines 301 and 302 to become more negative. This causes the forward bias of the non-addressed cells connectd to the bit lines 301 and 302 to be reduced and thereby reduces the current flowing into the other cells coupled to these bit lines. The state of the data in each of the non-addressed cells is maintained because the standby current before and after the read pulse IW is insufficient to discharge the capacitances C201, C202, and C212 associated with the non-addressed cells during the time of the read pulse IW.

Figure 3:
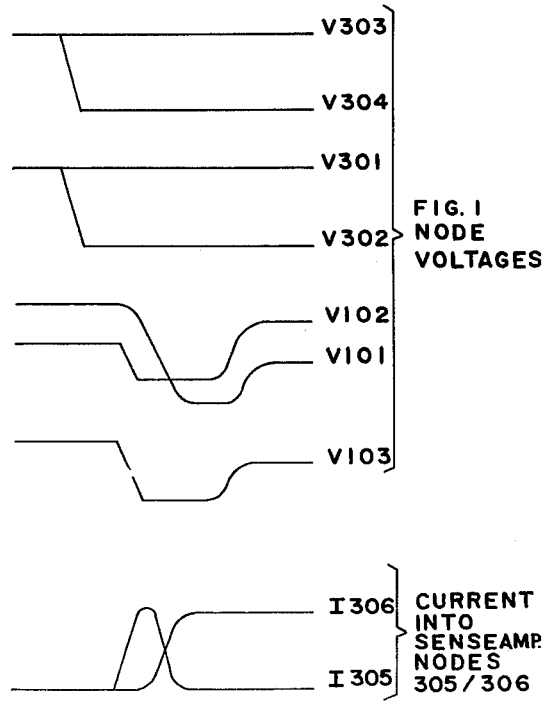
FIG. 3 is a pulse diagram illustrating the potentials and currents resulting from writing data into a cell.

Writing data into an individual cell is accomplished by application of appropriate potentials to one of the pair of bit lines and the corresponding word line associated with that cell as shown in FIG. 3. Assume transistor Q101 is on and it is desired to turn transistor Q102 on and transistor Q101 off. The potential V304 of node 304 is made more negative than the potential V303 of node 303. This will cause the potential V302 of line 302 to be less than the potential V301 of line 301. The potentials V101 and V102 of nodes 101 and 102 will remain approximately constant because of the bias on diodes D101 and D102. The potential V103 of line 103 is then made more negative by application of a write pulse IW.

The potential V101 of node 101 and potential V102 of node 102 will both begin falling. Potential V101, however, can only fall to a diode drop below potential V301, while potential V102 continues to drop until it is biased by potential V302 being more negative than potential V301. When node 103 is a base-emitter drop below node 101 then transistor Q102 will begin conducting. This will happen when the current through diode D101 charges capacitance C102 sufficiently. Potential V101 will be more positive than potential V102, transistor Q101 will trun off, and diode D102 will be forward biased. Therefore less current will flow through node 101 and its potential V101 and the potential V103 of node 103 will rise. The current I304 and I305 flowing into sense amplifier nodes 305 and 306 is also shown.

Cells that are not addressed but share the same bit line pairs are not affected during the write operation because the standby current during the write operation is insufficient to reduce the cell voltage levels during the write pulse IW. The forward bias across the coupling diodes D201 and D202 of non-addressed cells is reduced to effectively disconnect the non-addressed cells from the bit lines.

The memory cell described above offers numerous advantages over prior art static random access memory cells. In particular, individual memory cells do not require resistors. In an integrated circuit embodiment of the memory cells, this feature allows the size of the individual cells to be reduced as advances in semiconductor fabrication technology are made. The individual cells have a small logic swing on the order of 120 millivolts which allows very high speed operation of the memory array. Because each cell comprises only two transistor and two diodes, cells may be made smaller than cells of prior art memory arrays having a larger number of components. Because the cell deaddressed condition is the same as the condition when the power to all peripheral circuits is eliminated only a small amount of power is required to maintain the state of the data in the memory array.

Although one embodiment of the memory array of this invention is described above, it will be apparent to those skilled in the art that numerous variations may be made in the design and implementation of the array without departing from the spirit and scope of the invention as definded in the appended claims.

I claim:

1. A memory cell circuit comprising
a word line;
a pair of bit lines;
a first and second transistor each having a base, an emitter, and a collector, the first emitter and second emitter being coupled to the word line, the first base being coupled to the second collector and the second base being coupled to the first collector; and a first diode coupled between one of the bit lines and the first base and a second diode coupled between the other of the bit lines and the second base, the cell being powered by the bit lines.

2. A memory cell circuit in claim 1 further comprising a first and a second capacitance, the first capacitance being connected between the first base and the word line and the second capacitiance being connected between the second base and the word line.

3. A memory cell circuit as in claim 2 wherein the cell comprises an integrated circuit having a substrate.

4. A memory cell circuit as in claim 3 wherein a first connection is made between the first base and the second collector and a second connection is made between the second base and the first collector.

5. A memory cell circuit as in claim 4 wherein a first capacitance comprises the capacitance between the base and the emitter of the first transistor and the second capacitance comprises the capacitance between the base and the emitter of the second transistor.

6. A memory cell circuit as in claim 4 wherein a third capacitance comprises the capacitance between a first and a second connection.

7. A memory cell circuit as in claim 1 wherein each of the first and second transistor comprises an NPN transistor.

8. A memory cell circuit as in claim 1 wherein a first resistor is coupled between the pair of bit lines.

9. A memory cell circuit as in claim 8 wherein each bit line is switchably connected to a potential source.

10. A memory cell circuit as in claim 9 wherein the switchable connection comprises a switching transistor.

11. A memory cell circuit as in claim 10 wherein the switching transistor comprises an NPN transistor.

12. A memory cell circuit as in claim 1 wherein a word line is connected through a fourth capacitance to ground.

13. A memory cell circuit as in claim 12 wherein the word line is also connected to a current source.

14. A memory cell circuit comprising:
a word line;
a pair of bit lines;
a first and a second NPN transistor, each having a base, and an emitter, and a collector, the first emitter and the second emitter being coupled to the word line, the first base being coupled to the second collector and the second base being coupled to the first collector;
a first diode coupled between one of the bit lines and the first base, and a second diode coupled between the other bit line and the second base;
a first capacitance coupled between the base and the emitter of the first transistor and a second capacitance coupled between the base and the emitter of the second transistor;
a third capacitance coupled between the collector of the first transistor and the collector of the second transistor;
a fourth capacitance coupled between the word line and ground potential;
a first resistance coupled between the bit lines; and
means for applying electrical signals to each of the bit lines and the word line.

* * * * *